(12) United States Patent
Ashtiani et al.

(10) Patent No.: US 6,411,097 B1
(45) Date of Patent: Jun. 25, 2002

(54) ELECTRONIC CIRCUIT FOR MEASURING SERIES CONNECTED ELECTROCHEMICAL CELL VOLTAGES

(75) Inventors: Cyrus N Ashtiani, West Bloomfield, MI (US); Thomas A Stuart, Toledo, OH (US)

(73) Assignee: DaimlerChrysler Corporation, Auburn Hills, MI (US)

( * ) Notice: Subject to any disclaimer, the term of this patent is extended or adjusted under 35 U.S.C. 154(b) by 0 days.

(21) Appl. No.: 09/742,836

(22) Filed: Dec. 20, 2000

Related U.S. Application Data

(63) Continuation-in-part of application No. 09/224,466, filed on Dec. 31, 1998, now Pat. No. 6,166,549.

(51) Int. Cl.[7] .......................................... G01N 27/416
(52) U.S. Cl. ..................................................... 324/434
(58) Field of Search ................................ 320/162, 116, 320/119; 324/429, 433, 434

(56) References Cited

U.S. PATENT DOCUMENTS

| | | | |
|---|---|---|---|
| 5,646,534 A | 7/1997 | Kopera | 324/434 |
| 5,710,503 A | 1/1998 | Sideris | 324/431 |
| 5,760,488 A | 6/1998 | Sonntag | |
| 5,808,469 A | 9/1998 | Kopera | 324/434 |
| 5,824,432 A | 10/1998 | Currle | |
| 5,831,514 A | 11/1998 | Hilpert et al. | |
| 5,945,829 A | 8/1999 | Bertness | 324/430 |
| 6,020,718 A | * 2/2000 | Ozawa et al. | 320/112 |
| 6,147,499 A | * 11/2000 | Torii et al. | 320/119 |
| 6,166,549 A | * 12/2000 | Ashtiani et al. | 320/136 |

* cited by examiner

Primary Examiner—Gregory Toatley
(74) Attorney, Agent, or Firm—Ralph E. Smith

(57) ABSTRACT

An electronic circuit for measuring voltage signals in an energy storage device is disclosed. The circuit includes a plurality of battery segments forming the energy storage device. An amplifier circuit is connected across one of the battery segments for converting a differential voltage to a reference current. A sense resistor is associated with the amplifier circuit to convert the reference current to a voltage signal which is proportional to the voltage across the battery segment. A voltage measurement node associated with the sensing resistor may be used for measuring the voltage signal. In one embodiment of the invention, a multiplexing and sampling circuit provides digitized voltage samples to a processor. The voltage level of each cell within the battery pack can then be monitored by the processor.

18 Claims, 4 Drawing Sheets

ELECTRONIC CIRCUIT FOR MEASURING SERIES CONNECTED ELECTROCHEMICAL CELL VOLTAGES

CROSS-REFERENCE TO RELATED APPLICATIONS

This application claims the benefit of the filing date, and is a continuation-in-part of U.S. non-provisional application No. 09/224,466 filed Dec. 31, 1998, U.S. Pat. No. 6,166,549.

BACKGROUND OF THE INVENTION

1. Technical Field

The present invention generally relates to an electronic circuit for an energy storage device management system. More particularly, the present invention is directed to an electronic circuit for efficiently and accurately measuring individual voltages in a series connected electrochemical energy storage device which may be utilized with electric and hybrid vehicles.

2. Discussion

In order to commercialize electric and hybrid vehicles on a widespread basis, the energy storage devices or batteries, which are the most expensive component of the vehicle, must operate reliably through the life of the vehicle. In the typical configuration the batteries are formed from a stack of series connected electrochemical cells.

A common requirement for large stacks of electrochemical cells used in electric and hybrid vehicles, particularly in advanced applications such as lead acid, Li-Ion or NiMH battery packs, is the need to measure individual or groups of cell voltages almost simultaneously. In practice, this means the measurements should be taken within a time window of a few milliseconds.

With reference to FIG. 1, a common technique known within the prior art accomplishes voltage measurement through the use of a plurality of resistive divider circuits. More specifically, FIG. 1 shows an exemplary battery pack 10 having fortyeight energy storage cells B1 through B48 connected connected in series. A resistive voltage divider circuit 12 is connected between the positive terminal 16 of battery cells B2 through B48 and a common ground node 14. The discrete resistances $R_1, R_2, \ldots, R_n$, are selected such that the output potentials $V_{m1}, V_{m2}, \ldots, V_{mn}$ fall below a certain voltage limit, for example 4 volts, suitable for input to a multiplexer and A/D converter. The voltage signals from each resistive divider circuit 12 can then be sampled and digitally processed. The actual nodal voltages $V_1, V_2, V_3, \ldots, V_{48}$ become increasingly higher towards the top of the battery pack 10, such that in general:

$$V_{mn} = V_n \cdot k_n = V_n \cdot \frac{R_1}{R_1 + R_n} = 4V \Rightarrow V_n = \frac{V_{mn}}{k_n}; \forall n = 1, 2, \ldots$$

The voltage across each cell segment $V_{B1}, V_{B2}, \ldots, V_{B48}$ is then computed as the difference between the nodal voltages measured on either side of the cell according to the formula:

$$V_{Bn} = V_n - V_{n-1}$$

For example, the voltage $V_{B3}$ of cell B3 is measured by taking the difference between $V_3$ and $V_2$ provided by the respective voltage divider circuits 12.

The principal problem with this technique of voltage measurement is that a small error in measuring the nodal voltages $V_n$ translates into a large relative error in the measurement of segment voltages $V_{Bn}$. These errors increase as the nodal voltages $V_n$ become increasingly larger towards the top or higher potential cells of the battery pack 10. For example, suppose:

$k_{48} = \frac{1}{48}, k_{47} = \frac{1}{47}$ $V_{n48} = V_{48} \cdot k_{48} = 4 \text{ V}, \rightarrow V_{48} = 192 \text{ V}$, $V_{n47} = V_{47} \cdot k_{47} = 4 \text{ V}, \rightarrow V_{47} = 188 \text{ V}$, $\therefore V_{B48} = V_{48} - V_{47} = 4 \text{ V}$.

If $k_{48}$ is in error by=1%, and $k_{47}$ is in error by −1%, measurements of the nodal voltages indicate:

$V_{48} = 193.92\text{V}; V_{47} = 186 \times 12\text{V}$ $V_{B48} = 7.8\text{V}$, error=95%

Thus, the measurement error associated with this network of resistive divider circuits 12 and measurement technique could be in excess of 95%.

Furthermore, this error is nonuniformly distributed between the cell segments varying from a maximum of 2 percent at the bottom to a maximum of 2n× percent at the top of the battery pack 10. The latter renders this approach useless in applications where comparison of the cell segment voltages are used for diagnostics or corrective actions such as in cell balancing. Lastly, this conventional resistance network continues draining the cells of the battery pack 10 even when the resistance network is not in use.

While not specifically shown, a matrix of electromechanical relays can also be used for selectively switching across the cell segments of the battery pack. This approach results in slow measurement of cell voltages and is therefore not suitable for modern applications. In addition, such a relay based device also becomes too bulky and heavy for use with an electric or hybrid vehicle. Higher speed and accuracy can be achieved using a separate isolation amplifier for each battery segment, but this approach results in a relatively large and expensive system.

Accordingly, it is desirable to provide an electronic circuit for overcoming the disadvantages known within the prior art. It is also desirable to provide an electronic circuit which allows for a high degree of accuracy when measuring both the lowest potential cell voltages and the highest potential cell voltages. Moreover, it is desirable to provide a highly efficient electronic circuit which minimizes any loss within the circuit. Finally, it is desirable to provide an electronic circuit with various switched components to prevent the leakage of current from the energy storage device when the circuit is not being used.

SUMMARY OF THE INVENTION

According to the teachings of the present invention, a voltage transfer circuit for measuring the individual segment voltages within an energy storage device is disclosed. The circuit includes a plurality of battery segments forming the energy storage device. An amplifier circuit is connected across one of the battery segments for converting a differential voltage to a reference current. A sense resistor is associated with the amplifier circuit to convert the reference current to a voltage signal which is proportional to the voltage across the battery segment. A voltage measurement node associated with the sensing resistor may be used for measuring the voltage signal. In one embodiment of the invention, a multiplexing and sampling circuit provides digitized voltage samples to a processor. The voltage level of each cell within the battery pack can then be monitored by the processor.

BRIEF DESCRIPTION OF THE DRAWINGS

Additional objects, advantages and features of the present invention will become apparent from the following description and appended claims, taken in conjunction with the accompanying drawings in which:

DETAILED DESCRIPTION OF THE PREFERRED EMBODIMENT

Figure 1:
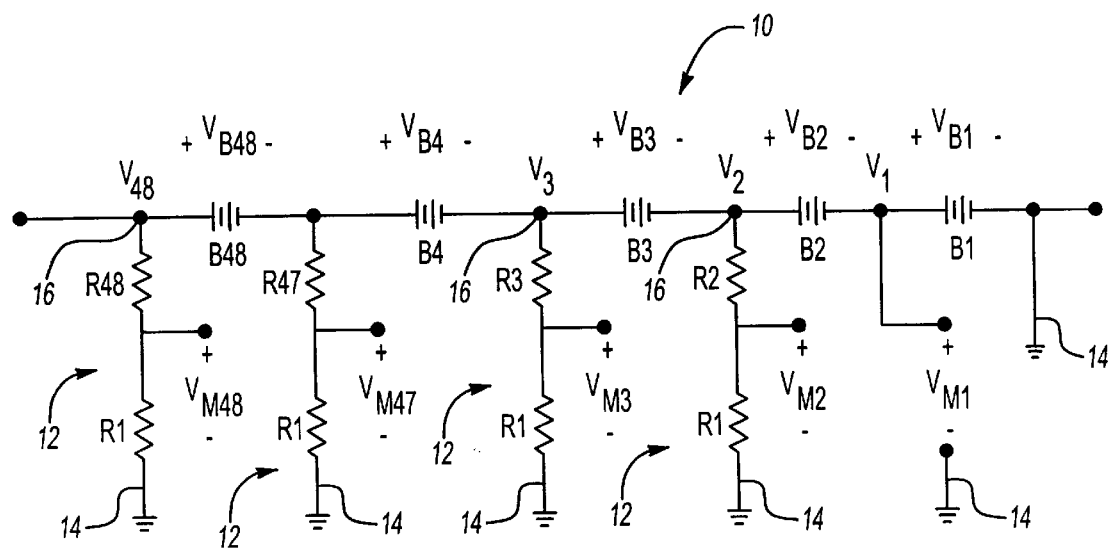
FIG. 1 is a schematic diagram of a prior art resistive voltage divider circuit used in conjunction with a series battery pack.
Figure 2:
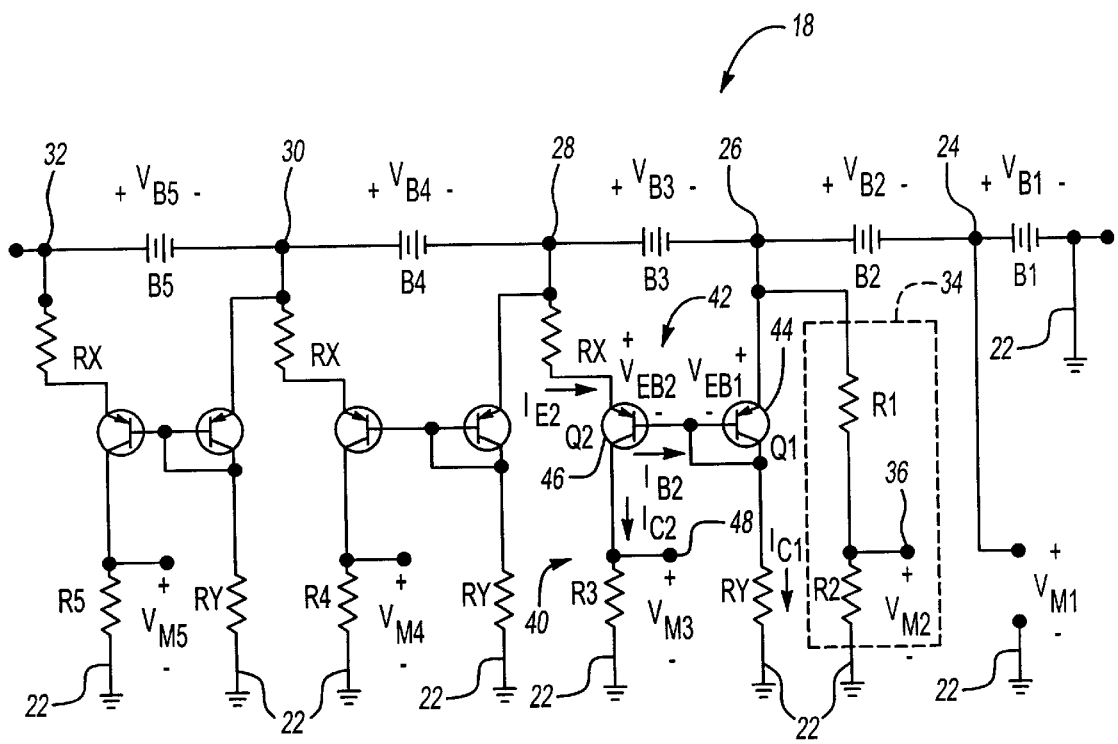
FIG. 2 is a schematic diagram of the electronic circuit for a series battery pack in accordance with an embodiment of the invention.

Turning now to FIG. 2, the electronic voltage measuring circuit of the present invention is shown. The voltage measuring circuit 18 operates in conjunction with a series of five energy storage cells B1 through B5 forming battery pack 20. As shown, node 22 is the common ground node which is also connected to the negative terminal of battery B1. Node 24 forms the connection between the positive terminal of battery B1 and the negative terminal of battery B2. Node 26 forms the connection between battery B2 and battery B3. Node 28 forms the connection between battery B3 and battery B4. Node 30 forms the connection between battery B4 and battery B5. Finally, node 32 forms the connection to the positive terminal of battery B5.

A resistive voltage divider circuit 34 is connected between node 26 and the common ground node 22. The voltage divider circuit 34 is formed by resistor R1 and resistor R2 with a voltage measurement node 36 disposed therebetween. The electronic circuit 40 of the present invention is connected across battery B3 using nodes 26 and 28. The electronic circuit 40 includes a temperature compensation circuit 42 which is formed by a first pnp transistor 44 and a second pnp transistor 46. As shown, the bases of transistors 44 and 46 are connected together, and are commonly connected to the collector of transistor 44. Thus, the temperature compensation circuit 42 functions as a current mirror within electronic circuit 40 and assists in isolating the voltage across its associated battery cell segment B3, so that the cell voltage $V_{B3}$ can be measured with a significantly higher degree of accuracy.

The emitter of transistor 44 is connected to node 26, and the collector of transistor 44 is connected to biasing resistor Ry, which is then connected to the common ground node 22. The emitter of transistor 46 is connected to resistor $R_x$, which is in turn connected to node 28, and the collector of transistor 46 is connected to resistor R3. The collector of transistor 46 also forms the voltage measurement node 48. As will be appreciated, resistor $R_x$ and resistor R3 form the primary measurement components of the electronic circuit 40. Additionally, identical electronic circuits 40 are also connected across battery cells B4 and B5, and function in a substantially similar manner.

Figure 3:
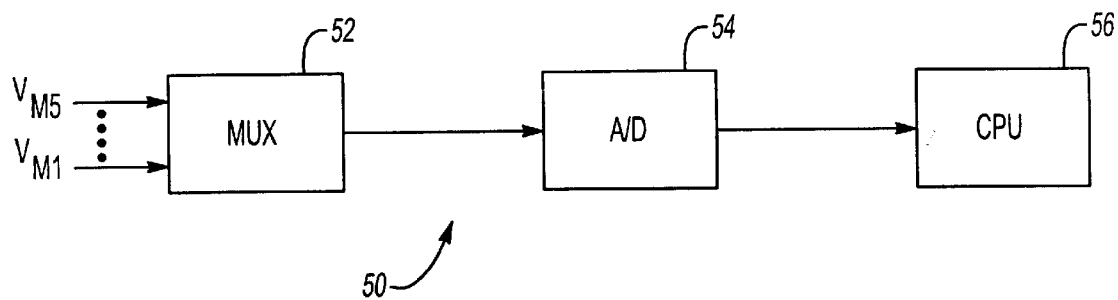
FIG. 3 is a schematic diagram of the multiplexing and sampling circuit in accordance with the invention.

With brief reference to FIG. 3, the processing circuit 50 associated with the voltage measuring circuit 18 of the present invention is shown. The processing circuit 50 includes a multiplexer 52 which receives the individual cell segment voltage signals $V_{m1}$ through $V_{m5}$ from the individual electronic voltage measurement circuits 40, the resistive voltage divider circuit 34, and voltage node 24. The output of multiplexer 52 is provided to an A/D converter 54 so that the individual voltage signals can be digitally sampled and communicated to a suitable processor 56. The processor 56 is then able to directly monitor the individual cell segment voltages, and use this information for functions such as cell diagnostics and cell equalization.

The present invention involves a modification to the resistive voltage divider circuit, disclosed in FIG. 2, that creates a voltage signal across the measuring resistances $R_3$, $R_4$, $R_5$ ..., $R_n$ which is directly proportional to the actual battery cell segment voltages $V_{B3}$, $V_{B4}$, $V_{B5}$, ... $V_{Bn}$ that are being measured.

In operation, the electronic circuit 40 of the present invention is described in conjunction with a battery pack of five v lithium ion cells as shown in FIG. 2. Assuming the A/D converter 54 can measure voltages up to +5V DC, $V_{B1}$ can be measured directly from node 24 which produces voltage signal $V_{m1}$, and $V_{B2}$ can be measured using a ±1% resistive divider circuit 34 from node 36 which produces voltage signal $V_{m2}$ and then subtracting the $V_{B1}$ measurement. For $V_{B3}$, note that $$V_{B3}=I_{E2}R_x+V_{EB2}-V_{EB1}$$

If $R_x$ and $R_y$ are so selected and Q1 and Q2 are operated so that, $V_{EB2} \cong V_{EB1}$, then from above:

$$V_{B3} \cong I_{E2}R_x$$

Since $I_{E2} >> I_{B2}$, then $I_{E2}=B_{B2}+I_{C2} \cong I_{C2}$, and $$\frac{V_{B3}}{V_{m3}} = \frac{I_{E2}R_X}{I_{C2}R_3} = \frac{R_X}{R_3}$$

In this circuit a direct measurement of $V_{m3}$ will be proportional to the voltage across the cell segment $V_{B3}$ and the measurement error will be % uniformly across the stack provided that $V_{EB1}$ and $V_{EB2}$ are approximately equal. As will be appreciated, the electronic circuit 40 of the present invention allows for the measurement of the voltage across each battery cell segment with a significantly higher degree of accuracy. Accordingly, the higher potential battery cell segments can be measured with nearly the same degree of accuracy as the lower potential battery cell segments because the electronic circuit 40 serves to measure only the voltage across an isolated battery cell segment, rather than measure the voltage potential of the cell segment with respect to ground.

In the actual implementation, $V_{EB}$, and $V_{EB2}$ cannot be matched perfectly, but if transistors 44 and 46 are mounted or formed in the same package, they can easily be matched within a few millivolts with respect to both initial tolerance and wide temperature ranges. This provides a very small and inexpensive measurement system which has about the same tolerance as the components. As will be appreciated by one skilled in the art, the remaining voltage measurements $V_{B4}$, $V_{B5}, \ldots, V_{Bn}$ are performed in the same manner as $V_{B3}$. As part of the present invention, it should be noted that the resistance values are chosen such that $R_2=R_3=R_4=R_5$ and $R_1=R_x$.

An alternate less preferred approach employs discrete transistors rather than a matched pair of transistors. Using discrete devices reduces the cost of the circuit and improves manufacturability, but increases the error associated with the voltage measurement, The increased error is caused by using separate pieces of silicon to fabricate the transistors and the differences in the operating temperature of each discrete device. The increased error associated with employing discrete devices is a function of the amplitude of the segment voltage that is being measured. Larger valued segment voltages result in a decreased error associated with mismatching of the transistor $V_{EB}$'s. For example, assuming a $V_{EB}$ mismatch of 0.2 volts and a nominal segment voltage of 4 volts, the error due to $V_{EB}$ mismatch is 5%.

Figure 4:
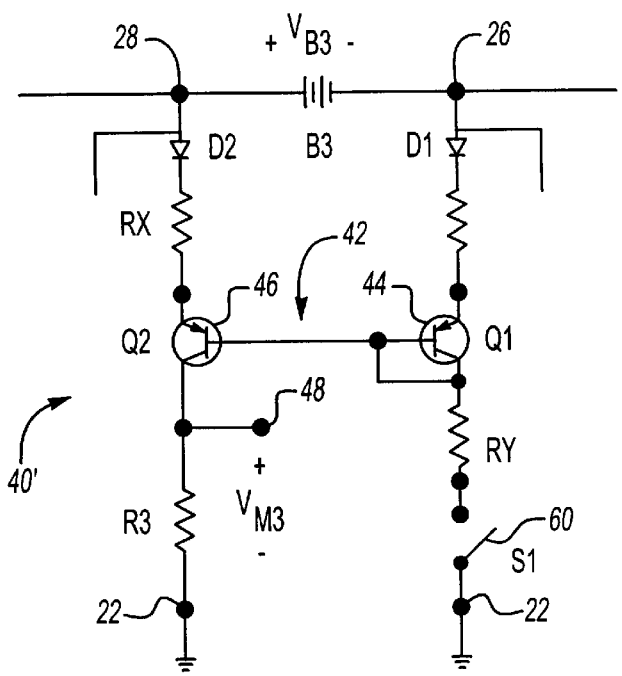
FIG. 4 is an electronic circuit having on-off control for minimizing leakage current for use with a series battery pack in accordance with an alternate embodiment of the invention.

An alternate embodiment of the electronic circuit of the present invention is disclosed in FIG. 4. The components of the electronic circuit 40' are substantially similar to those of the circuit shown in FIG. 2. As an additional feature, a switch 60 is connected between the resistor $R_y$ and the common ground node 22. According to this embodiment of the electronic circuit 40', no current will flow through either side of the temperature compensation circuit 42 until switch 60 is closed. As part of the present invention, the switch 60 can be implemented with a semiconductor switch.

The anode of a diode D1 is connected to node 26, or the negative terminal of the battery cell B3, and the cathode is connected to transistor 44. The diode D1 prevents reverse $V_{EB2}$ avalanche and the resulting battery leakage current if $V_{B3}$ is above approximately 5–6V. The anode of a diode D2 is connected to node 28, or the positive terminal of the battery cell B3, and the cathode is connected to resistor Rx. The diode D2 is required for temperature compensation of diode D1.

Figure 5:
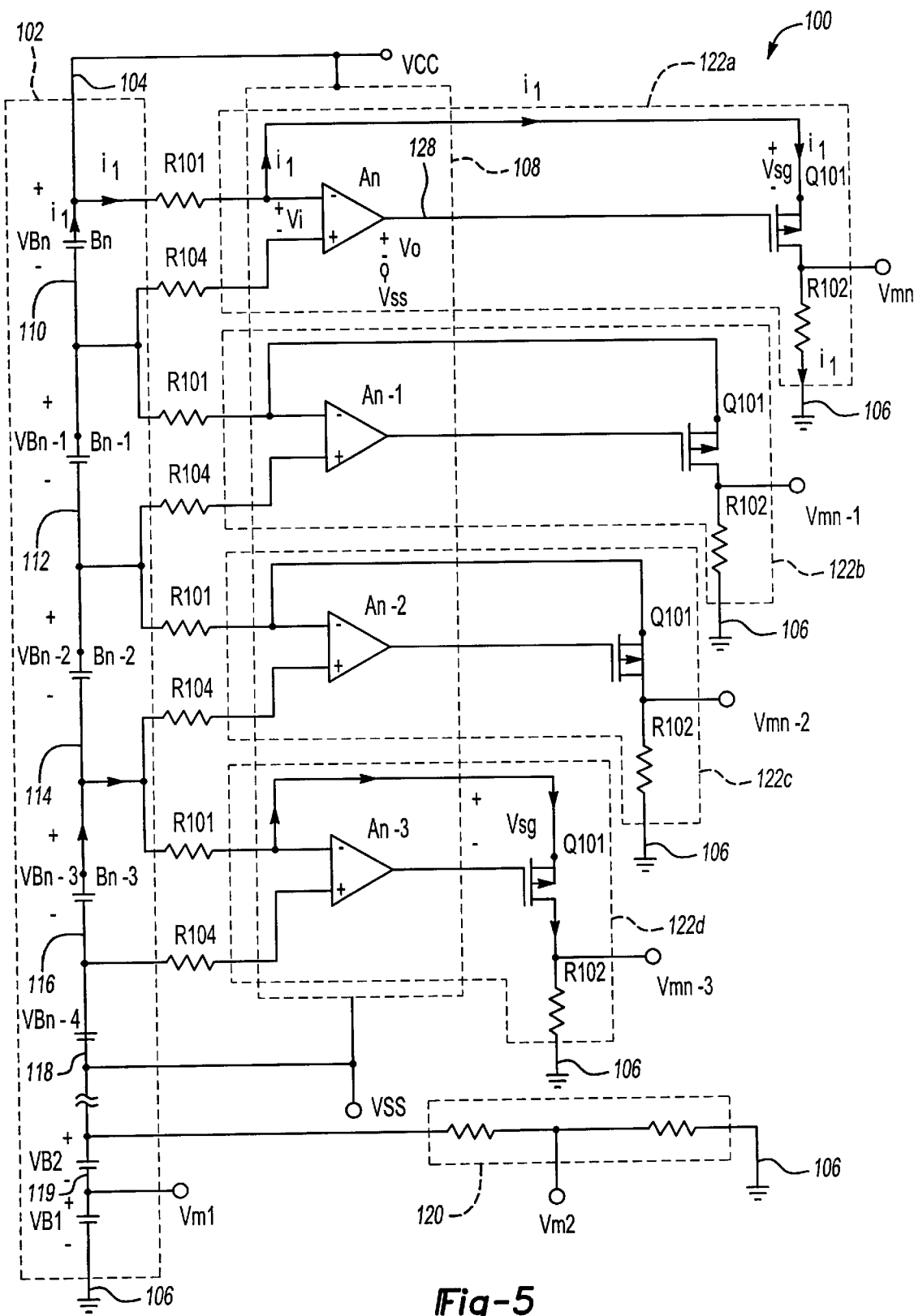
FIG. 5 is a schematic diagram of a voltage transfer circuit for use with a series battery pack constructed in accordance with the principles of the invention.

Referring to FIG. 5, a voltage transfer circuit 100 for use with a battery pack 102 is shown. The voltage transfer circuit 100 is particularly suitable for operation in conjunction with battery packs that are formed of relatively low voltage segments of about 1.0 volt to 5.0 volts such as with Li-Ion batteries. However, the scope of the invention includes using higher voltage battery segments such as are typical with NiCad, NiMH, and lead acid battery backs. Battery segments typically are formed from one or more battery cells having a characteristic voltage generally ranging from 0.8 volts to 4.5 volts. The battery pack 102 associated with the voltage transfer circuit 10 comprises series connected battery segments B1 through Bn each of which consists of a single Li-Ion battery cell.

Node 104 forms the connection between a positive terminal of the battery pack 102 and the Vcc input of an amplifier quad pack 108. Node 106 is the common ground node which connects to a negative terminal of the battery pack 102. Node 110 forms the connection between battery segment Bn and battery segment Bn−1. Node 112 forms the connection between battery segment Bn−1 and battery segment Bn−2. Node 114 forms the connection between battery segment Bn−2 and battery segment Bn−3. Node 116 forms the connection between battery segment Bn−3 and battery segment B2. Node 118 forms the connection between battery segment Bn−4 and battery is segment Bn−5 (not shown). Node 119 forms the connection between battery segment B2 and battery segment B1.

A resistive voltage divider circuit 120 is connected between node 116 and common ground node 106. Voltage divider circuit 120 is formed by resistors R1 and R3 with voltage measurement node $V_{m2}$ disposed therebetween.

Connected across each of the battery segments Bn through Bn−3 is a corresponding amplifier circuit 122a through 122d. Each amplifier circuit 122 includes an input resistor 124 R101, connected between the positive terminal of the battery segment, Bn, and the negative input of a corresponding amplifier, An. An input resistor 126 R104, is connected between the negative terminal of the battery segment, Bn, and the positive input of the corresponding amplifier, An. The negative input and an output 128 of the amplifier, An, respectively connect to the source and gate of a buffer transistor Q101 130. The drain of Q101 connects to sense resistor R102 132 with voltage measuring node $V_{mn}$ disposed therebetween. The buffer transistor 130 is preferably a PMOS FET, however the scope of the invention includes other transistors such as PNP transistors. The other terminal of sense resistor R102 connects to common ground node 106. Input resistors R101 and R104, and sense resistor R102 are preferably selected so that each has the same value within each amplifier circuit 122, thus maintaining consistent voltage translation ratios corresponding to each battery segment. However, it is within the scope of the invention to select differing voltage translation ratios and resistor values.

In operation, amplifier circuit 122 senses the voltage across the corresponding battery segment, Bn, and translates the sensed voltage to a proportional voltage that is referenced to common ground node 106. To achieve equilibrium the differential voltage across the inputs of the amplifier An must be approximately zero volts. Therefore, $$VBn = i1 * R101$$

and $$VBn-1 + VBn-2 + VBn-3 + VBn-4 + = VSG + Vo$$

where;
i1 is the current through R101,
VSG is the transistor source-gate voltage, and
Vo is the amplifier output voltage referenced to Vss.

Vo will adjust so that VSG maintains equilibrium, and
Vmn = I1*R102 = (R102/R101)*VBn The voltage transfer circuit 100 eliminates current gain (beta) induced error associated with PNP transistor circuits. In addition, an inexpensive amplifier such as an LM224 may be used in the voltage transfer circuit 100 since low input voltage offset drift is not required.

For example, an LM224 (typical offset drift of +/−7 uV/C) produces the following results for a temperature change of 50 C.

$$\Delta V = \pm 7 \, \mu V/°C. \times 50° C. = \pm 0.35 \, mV.$$

This shows that I1*R101 would have to change by only 0.35 mV to compensate 50 degrees of temperature change.

For a battery segment voltage of 4 volts, this represents an error of only 0.009%, whereas the +/−1 bit error of a conventional A/D is approximately +/−0.125% when using a 5 Vdc reference. This shows that temperature variation is primarily dependent only on the temperature induced error of the R102/R101 ratio. The calibration procedure to reduce the initial tolerance is the same as described above for FIGS. 3 and 4.

Figure 6:
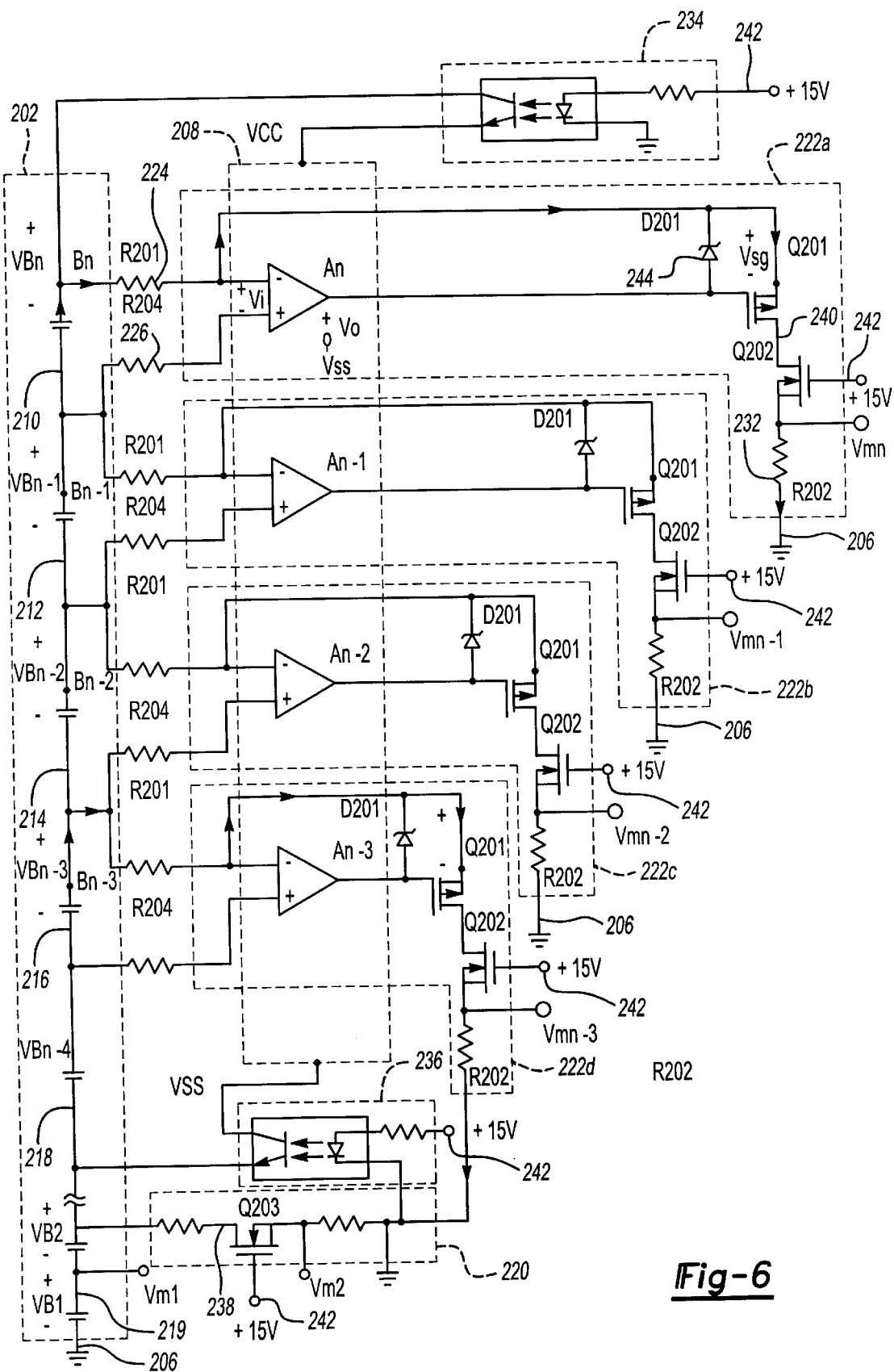
FIG. 6 is a schematic diagram of a voltage transfer circuit having on-off control for minimizing leakage current for use with a series battery pack in accordance with a presently preferred embodiment of the invention.

FIG. 6 is a schematic diagram of a presently preferred embodiment of a voltage transfer circuit 200 in accordance with the principles of the invention. The voltage transfer circuit 200 is similar to voltage transfer circuit 100 in function with corresponding elements numbered in the range 200–299, except that voltage transfer circuit 200 includes on-off control circuitry for minimizing leakage current. Optical switch circuit 234 is connected between the positive terminal of the battery pack 202 and Vcc of the quad amplifier pack 208. Optical switch circuit 236 is connected between node 218 and Vss of the quad amplifier pack 208. Each amplifier circuit 222 additionally includes a control switch Q202 connected to node 240 in series with the sense resistor 232. The divider circuit additionally includes a control switch Q203 connected in series with R201 and R203. The optical switch circuits 234 and 236, and control switches Q202 and Q203 are controlled by the application of a control voltage 242. Preferably, 15 volt is applied as the control voltage 242 to turn-on the voltage transfer circuit 200. An open or 0 volts applied as the control voltage 242 causes the voltage transfer circuit 200 to turn-off. The on-off control circuitry advantageously mitigates the flow of leakage currents drawn from the battery pack during periods when the voltage transfer circuit 200 is off. Leakage currents can add up to a significant loss in battery energy when the system remains inactive or in storage for several weeks. During storage or inactive periods, the optical switch circuit 234 disconnects the battery pack from Vcc of the quad amplifier pack 208. However, in spite of the operation of optical switch 234, the amplifier inputs remain connected to the battery pack 202 providing a path for leakage currents. To open the paths to the amplifier inputs, it is desirable to disconnect Vss using optical switch 236 and to also disconnect the amplifier outputs using the Q202 transistors. Preferably, FETs are used instead of BJTs for Q201 in the amplifiers 222 to further reduce the flow of leakage current. A zener diode, D201, 244 is connected in parallel with the gate-source junction of transistor Q201 to protect the junction from damaging voltages during the off-state.

The foregoing discussion discloses and describes exemplary embodiments of the present invention. One skilled in the art will readily recognize from such discussion, and from the accompanying drawings and claims, that various changes, modifications, and variations can be made therein without departing from the spirit and scope of the invention as defined in the following claims.

What is claimed is:

1. A voltage transfer circuit for measuring voltage signals in an energy storage device, comprising:
    a plurality of battery segments forming the energy storage device;
    an amplifier circuit connected across one of the battery segments for converting a differential voltage to a reference current;
    a sense resistor associated with the amplifier circuit to convert the reference current to a voltage signal which is proportional to the voltage across the battery segment; and
    a voltage measurement node associated with the sensing resistor for measuring the voltage signal.

2. The voltage transfer circuit of claim 1 further including a voltage divider circuit connected to at least one of the energy storage cells.

3. The voltage transfer circuit of claim 2 wherein the voltage divider circuit is a resistive voltage divider circuit.

4. The voltage transfer circuit of claim 1 wherein the amplifier circuit includes a buffer transistor.

5. The voltage transfer circuit of claim 1 further including on-off control circuitry to minimize off mode leakage current.

6. The voltage transfer circuit of claim 5 wherein the amplifier circuit has a power pin;
    the on-off control circuitry including an optical switch to disconnect the amplifier power pin from the energy storage device.

7. The voltage transfer circuit of claim 5 wherein the on-off control circuitry includes a control switch in series with the sense resistor to limit leakage currents.

8. The voltage transfer circuit of claim 1 wherein the voltage signal is sampled by an A/D converter for monitoring by a processor.

9. The voltage transfer circuit of claim 2 wherein there is at least one more battery segment than amplifier circuit, the at least one more battery segment being coupled to a negative end of the energy storage device.

10. A voltage transfer circuit for measuring voltage signals in an energy storage device, comprising:
    a plurality of energy storage segments forming the energy storage device,
    an amplifier circuit coupled across one of the energy storage segments for converting a differential voltage to a reference current;
    a sense resistor associated with the amplifier circuit to convert the reference current to a voltage signal which is proportional to the voltage across the energy storage segment;
    a voltage measurement node associated with the sensing resistor for measuring the voltage signal; and
    a voltage divider circuit coupled across a negative terminal energy storage segment to measure a segment voltage, the negative terminal energy storage segment being coupled to a negative end of the energy storage device.

11. The voltage transfer circuit of claim 10 wherein the voltage divider circuit is a resistive voltage divider circuit.

12. The voltage transfer circuit of claim 11 wherein only one voltage divider circuit is connected to an energy storage segment.

13. The voltage transfer circuit of claim 10 wherein there are at least two amplifier circuits; and
    the negative terminal energy storage segment provides an input offset voltage for one of the amplifier circuits.

14. The voltage transfer circuit of claim 10 wherein the amplifier includes a buffer transistor to regulate the reference current.

15. The voltage transfer circuit of claim 10 further including on-off control circuitry to minimize off mode leakage current.

16. The voltage transfer circuit of claim 15 wherein the amplifier circuit has a power pin;

the on-off control circuitry including an optical switch to disconnect the amplifier power pin from the energy storage device.

17. The voltage transfer circuit of claim 15 wherein the on-off control circuitry includes a control switch in series with the sense resistor to limit leakage currents.

18. A voltage transfer circuit for measuring voltage signals in an energy storage device, the energy storage device including a plurality of energy storage segments, comprising:

an amplifier circuit coupled across one of the energy storage segments for converting a differential voltage to a reference current, the amplifier circuit including a buffer switch to regulate the reference current;

a sense resistor coupled to the buffer transistor to convert the reference current to a voltage signal which is proportional to the voltage across the energy storage segment;

a voltage measurement node associated with the sensing resistor for measuring the voltage signal;

a voltage divider circuit coupled across another of the energy storage segments to measure a segment voltage; and on-off control circuitry coupled to the amplifier circuit to minimize off mode leakage current.

* * * * *

UNITED STATES PATENT AND TRADEMARK OFFICE
CERTIFICATE OF CORRECTION

PATENT NO.    : 6,411,097 B1
DATED         : June 25, 2002
INVENTOR(S)   : Ashtiani et al.

It is certified that error appears in the above-identified patent and that said Letters Patent is hereby corrected as shown below:

Title page,
Item [73], Assignee, after "DaimlerChrysler Corporation, Auburn Hills, MI (US)", please insert -- University of Toledo, Toledo, Ohio (US) --

Signed and Sealed this

Fifth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,411,097 B1
DATED : June 25, 2002
INVENTOR(S) : Ahstianl et al.

It is certified that error appears in the above-identified patent and that said Letters Patent is hereby corrected as shown below:

Column 1,
Line 12, should read as follows:
-- STATEMENT REGARDING FEDERALLY SPONSORED RESEARCH OR DEVELOPMENT
    This invention was made with Government support under NREL subcontract number ZAN-6-16334-01, prime contract number DE-AC36-83CH10093 issued by the Department of Energy. The government has certain rights in this invention. --.

Signed and Sealed this

Seventh Day of February, 2006

JON W. DUDAS
*Director of the United States Patent and Trademark Office*